(12) United States Patent
Potter, IV et al.

(10) Patent No.: US 7,010,454 B1
(45) Date of Patent: Mar. 7, 2006

(54) TEST SERVICES PROVIDER

(75) Inventors: Orville Jay Potter, IV, Seattle, WA (US); Peter Gerber, Sammamish, WA (US); Michael Paul Robinson, Redmond, WA (US)

(73) Assignee: Microsoft Corporation, Redmond, WA (US)

( * ) Notice: Subject to any disclaimer, the term of this patent is extended or adjusted under 35 U.S.C. 154(b) by 6 days.

(21) Appl. No.: 10/815,121

(22) Filed: Mar. 31, 2004

(51) Int. Cl.
*G01M 19/00* (2006.01)

(52) U.S. Cl. .................. 702/122; 702/119; 702/120; 717/124

(58) Field of Classification Search ............. 702/108, 702/117, 119, 120, 122, 123, 182, 183, 185, 702/186; 717/124, 126; 714/27, 38, 46
See application file for complete search history.

(56) References Cited

U.S. PATENT DOCUMENTS 6,002,868 A * 12/1999 Jenkins et al. ............. 717/105
6,560,721 B1 * 5/2003 Boardman et al. ........... 714/33
2004/0220765 A1 * 11/2004 Gluch ...................... 702/119

OTHER PUBLICATIONS

"Use of a Java Interface to define Multiple Test Arguments", Nov. 2000, UK IBM Technical Disclosure Bulletin, Issue 439, p. 4022; NNRD439139.*

* cited by examiner

*Primary Examiner*—Marc S. Hoff
*Assistant Examiner*—Manuel L Barbee
(74) *Attorney, Agent, or Firm*—Merchant & Gould P.C.; Mark R. Hennings

(57) ABSTRACT

A test services provider is an object that is arranged to provide a standardized interface for calling test harness provided functionality. The test services provider is not tied to a specific test harness, and provides a standard interface such that both test harness functionality and test cases can be written without beforehand knowledge of the other. In operation, the test harness registers the test services that provides with the test service provider, and the test cases retrieve the registered test services from the test harness as needed. Accordingly, the test case does not have to query the test harness itself for the object that provides the desired test harness functionality, but rather uses a standardized interface provided by the test services provider to retrieve the desired test services.

8 Claims, 4 Drawing Sheets

TEST SERVICES PROVIDER

BACKGROUND OF THE INVENTION

Test automation systems are used to automatically test software-driven systems. Conventional architectures consist of a test harness, which is typically used to execute test cases specified by attributes of the test cases. The attributes are used to label classes or methods to mark which of the classes or methods should be examined for testing.

Conventional test harnesses usually provide some kind of functionality that is used by tests. The functionality may include, for example, logging, a way to retrieve or manipulate data about the test from the test automation system, or even perhaps a way to exchange data between machines in a multiple machine test. The use of test harness functionality by the test case has the effect of tying the test case to a specific test harness, which is undesirable.

Additionally, the test case must query the test harness for the object that provides a desired functionality, which usually requires beforehand knowledge of the test harness architecture. The variety of functionality in conventional test harnesses usually results in differences between the test harnesses such that a test is only able to run in a single test harness, which is undesirable.

In accordance with the present invention, a test harness can be reused without requiring modifications to run tests written using different test case formats.

SUMMARY OF THE INVENTION

The present invention is directed towards a test services provider, which is an object that is arranged to provide a standardized interface for calling test harness-provided functionality. A test service is an object that is used by the test to perform a well-defined, specific task, which is described by a standardized interface that various test harnesses can implement. The test services provider is not tied to a specific test harness, and provides a standard interface such that both test harness functionality and test cases can be written without beforehand knowledge of the other. In operation, the test harness registers the test services it provides with the test services provider, and the test cases retrieve the registered test services from the test services provider as needed. Accordingly, the test case does not have to query the test harness itself for the object that provides the desired test harness functionality, but rather it requests a standardized interface from the test services provider, which is known to implement the desired test harness functionality and is common among all test harnesses which support said functionality.

According to one aspect of the invention, a computer-readable medium having computer-executable components comprises three components. A test case scenario object that comprises test methods that are arranged to test an electronic system. A test harness is arranged to provide system test services. A test services provider is arranged to register the system test services and to invoke a particular registered test service from the test harness in response to a request from a test case scenario object test method requesting the particular registered test service.

According to another aspect of the invention, a method for executing test components comprises providing test methods that are arranged to test an electronic system. Test services are provided that are associated with a test harness. The test services are registered with a test services provider. One of the test methods is executed. A registered test service is invoked in response to a request from the executing test method.

According to yet another aspect of the invention, a system for automated testing comprises three components. A test case scenario object that comprises test methods that are arranged to test an electronic system. A test harness is arranged to provide system test services. A test services provider is arranged to register the system test services and to invoke a particular registered test service from the test harness in response to a request from a test case scenario object test method requesting the particular registered test service.

According to a further aspect of the invention, a system for automated testing comprises five means. Means for providing test methods that are arranged to test an electronic system. Means for providing test services that are associated with a test harness. Means for registering the test services with a test services provider. Means for executing one of the test methods. Means for invoking a registered test service in response to a request from the executing test method.

DETAILED DESCRIPTION OF THE PREFERRED EMBODIMENT

Throughout the specification and claims, the following terms take the meanings explicitly associated herein, unless the context clearly dictates otherwise. The terminology and interface specifications used herein are not intended to represent a particular language in which a particular object or method should be written. Rather, the terminology and interface specifications are used to describe the functionality and contents of an interface or object, such as function names, inputs, outputs, return values, and what operations are to be performed using the interface (or what operations are to be performed by the object).

Illustrative Operating Environment

Figure 1:
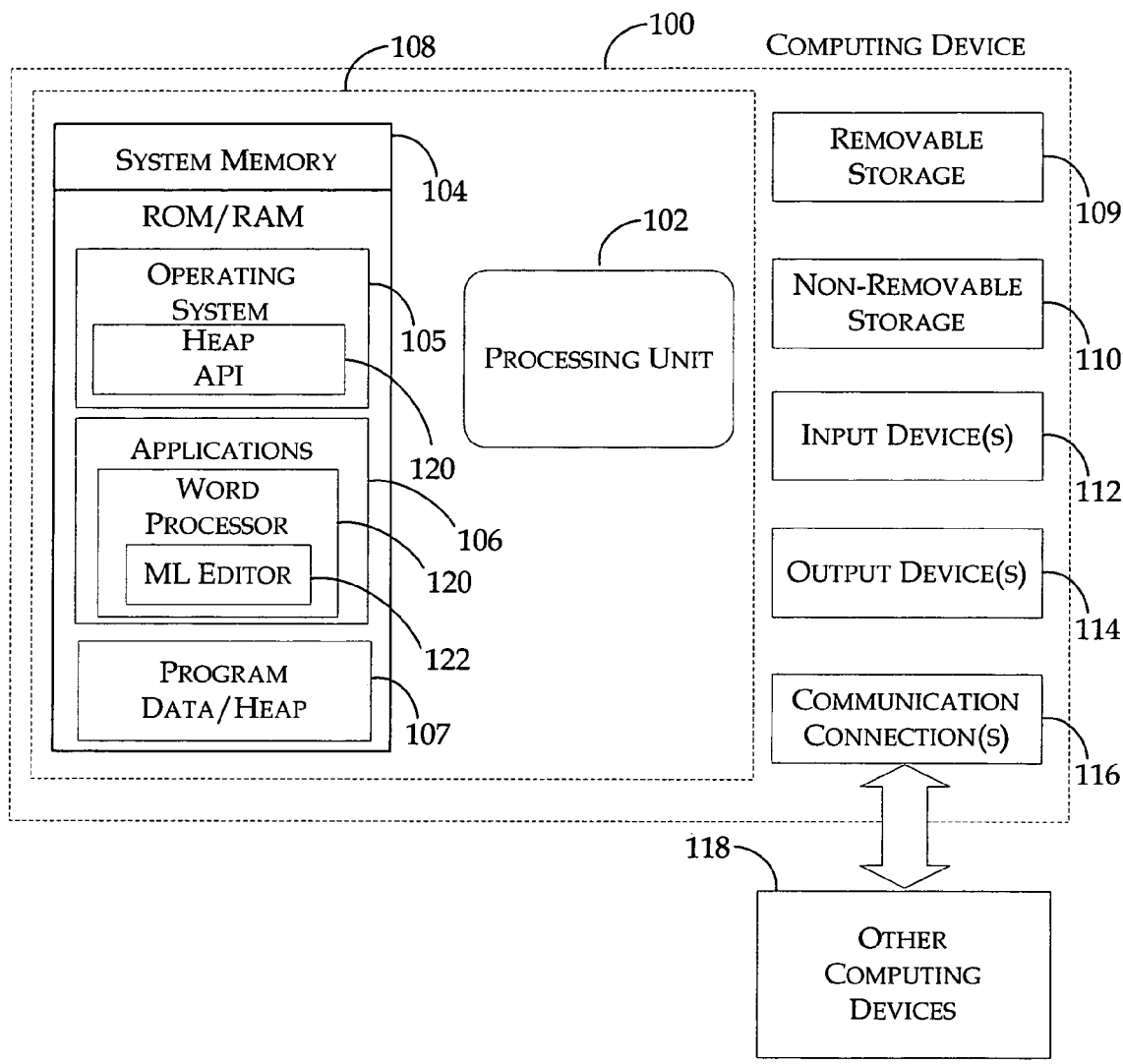
FIG. 1 illustrates an exemplary computing device that may be used in one exemplary embodiment of the present invention.

With reference to FIG. 1, one exemplary system for implementing the invention includes a computing device, such as computing device 100. In a very basic configuration, computing device 100 typically includes at least one processing unit 102 and system memory 104. Depending on the exact configuration and type of computing device, system memory 104 may be volatile (such as RAM), non-volatile (such as ROM, flash memory, etc.) or some combination of the two. System memory 104 typically includes an operating system 105, one or more applications 106, and may include program data 107. In one embodiment, application 106 may include a word-processor application 120 that further includes ML editor 122. This basic configuration is illustrated in FIG. 1 by those components within dashed line 108.

Computing device 100 may have additional features or functionality. For example, computing device 100 may also include additional data storage devices (removable and/or non-removable) such as, for example, magnetic disks, optical disks, or tape. Such additional storage is illustrated in FIG. 1 by removable storage 109 and non-removable storage 110. Computer storage media may include volatile and nonvolatile, removable and non-removable media implemented in any method or technology for storage of information, such as computer readable instructions, data structures, program modules, or other data. System memory 104, removable storage 109 and non-removable storage 110 are all examples of computer storage media. Computer storage media includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by computing device 100. Any such computer storage media may be part of device 100. Computing device 100 may also have input device(s) 112 such as keyboard, mouse, pen, voice input device, touch input device, etc. Output device(s) 114 such as a display, speakers, printer, etc. may also be included. These devices are well know in the art and need not be discussed at length here.

Computing device 100 may also contain communication connections 116 that allow the device to communicate with other computing devices 118, such as over a network. Communication connection 116 is one example of communication media. Communication media may typically be embodied by computer readable instructions, data structures, program modules, or other data in a modulated data signal, such as a carrier wave or other transport mechanism, and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. The term computer readable media as used herein includes both storage media and communication media.

The present invention is directed towards a test services provider, which is an object that is arranged to provide a standardized interface for calling test harness-provided functionality. A test service is an object that is used by the test to perform a well-defined, specific task, which is described by a standardized interface that various test harnesses can implement. The test services provider is not tied to a specific test harness, and provides a standard interface such that both test harness functionality and test cases can be written without beforehand knowledge of the other. In operation, the test harness registers the test services it provides with the test services provider, and the test cases retrieve the registered test services from the test services provider as needed. Accordingly, the test case does not have to query the test harness itself for the object that provides the desired test harness functionality, but rather it requests a standardized interface from the test services provider, which is known to implement the desired test harness functionality and is common among all test harnesses which support said functionality.

Test Automation System Architecture

Figure 2:
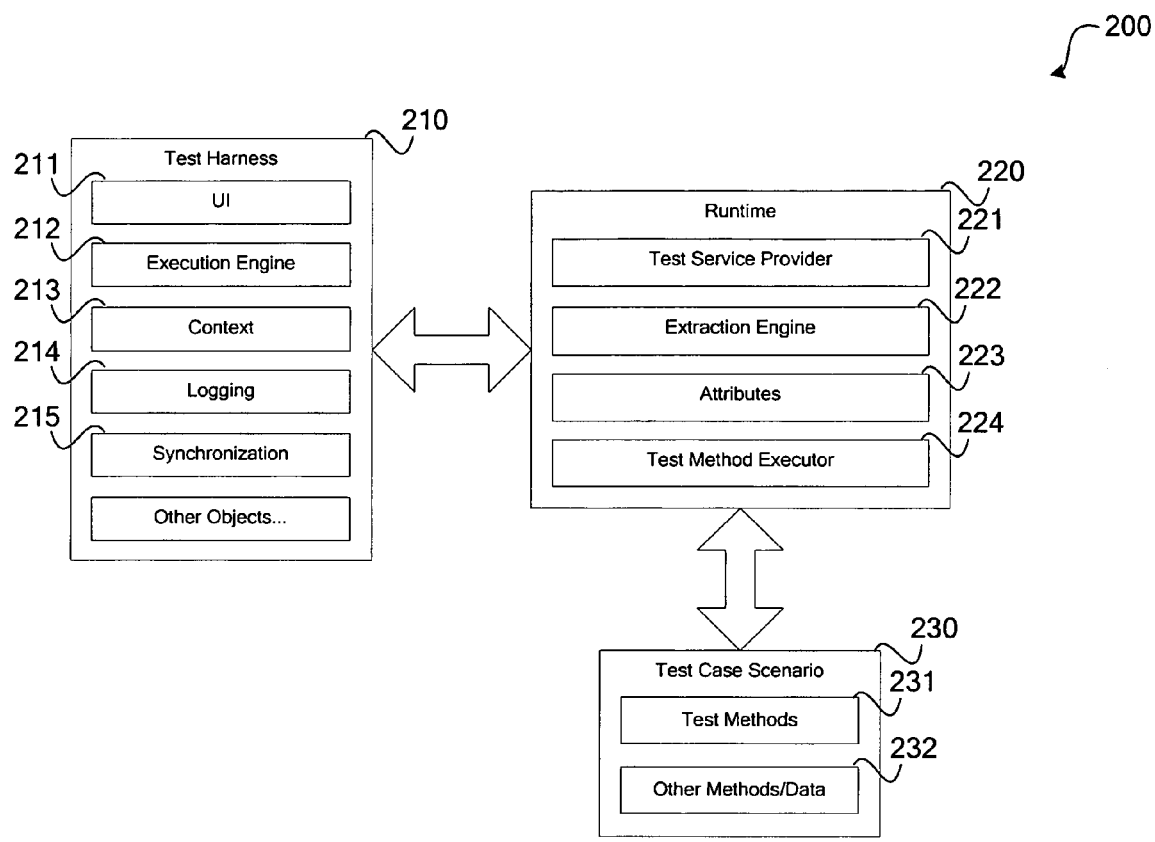
FIG. 2 is a block diagram illustrating an exemplary environment for practicing the present invention.

FIG. 2 is a block diagram illustrating an exemplary environment for practicing the present invention. The exemplary environment shown in FIG. 2 is a test automation system 200 that comprises test harness 210, test runtime 220, and test case scenario 230.

Test Runtime

In one embodiment, test runtime 220 is a collection of objects that abstracts knowledge of test cases from the test harness. Test runtime 220 typically comprises test services provider object 221, extraction engine 222, attributes 223, and test method executor 224. Test runtime 220 can be used by different harnesses to provide consistent support for a particular type of test case format. By extension, a test harness can use different test runtimes to support different types of test case formats. The test harness typically determines which test runtime to use for a particular test case format.

Test case extraction is accomplished through a dedicated extraction object (obtained from a test services provider object 221, described below), and invocation is performed by an object (test method executor 224, also described below), which returns a generic result to the test harness. The test method executor evaluates attributes using a generic interface to control the execution of the method.

A test harness is not required to, for example, evaluate attributes, determine the order that in which test methods should executed, build argument lists for method invocations, and the like. The test harness typically does not have direct access to this information required to perform those tasks, which helps ensure more consistent test execution between different test harnesses. All test harness dependent functionality (logging, "remoting," and the like) should be objects implemented by the test harness, described by an interface, and stored in the test service provider object for use during test execution. Accordingly, a test harness can be created which is easily capable of switching between different test runtimes without requiring changes to the test harness code.

Test Services

Test services provider object 221 is used by the test harness to retrieve an extraction engine and is also used by the test case scenario to retrieve objects for test harness-implemented functionality (including test services such as logging, synchronization, and the like).

The test services provider object typically provides methods that are used to facilitate access to test services. An AddService method is called to store references to objects that implement a test service. A test service object should implement a "generic" type, which facilitates a set of standard services that different harnesses can provide. The object passed in should implement functionality needed by attributes or test methods. This method should be called by the test harness for each service the test harness provides, which is generally done before the test methods are executed.

A GetService method is typically called to retrieve a type of test service object. The type passed in should represent an interface implemented by a test service object. An object that implements that object will be returned if found. If the object is not found, a value is returned that indicates such a result (e.g., returns a null). If a test or attribute requires a test service that is not present, the test method being executed should fail.

An AddDefaultServices protected method is typically called by the constructor. It is typically used to add whatever test services the test runtime provides by default, such as an extraction engine.

The test services provider object data and method calls should be static such that the data set by the test harness can be retrievable by other calls to the test service provider at a point later in time. The object is typically a class that implements the functionality described above. The constructor of the object is typically used to call the AddDefaultServices method.

Extraction Engine

Extraction engine 222 is used to retrieve an ordered list of test methods from the test case for the test harness for a particular test case scenario. Typically there is only one extraction engine present in a test runtime.

A GetTestMethodWrappers method is used to retrieve the ordered list of test methods for a test case scenario. (A test method wrapper is a particular implementation of a test method executor.) A parameter is passed into the method that represents a container that holds test cases. The method returns the ordered list of methods. If an error occurs while extracting the test case, an exception can be "thrown." If no test cases or test methods are found, an empty list is normally returned. An empty list is usually treated as a failure by the test harness. If additional data needs to be passed to the extraction engine, it can be provided through the TestServicesProvider object by a TestHarnessDataProvider test service.

A large part of the functionality present in an extraction engine object is the same between different runtimes; the only detail that may change significantly from one runtime to another is which attributes are used. An object should be created in order to facilitate easy creation of new extraction engines and runtimes. This class typically implement the functions:

TypeIsATestCase returns a "true" if the type passed in is a test case, "false" if not. This function examines the attributes present on a type by looking for a test case attribute to determine if a type is a test case or not.

MethodIsATestMethod returns true if the method passed in is a test method, false if not. This function examines the attributes present on a type by looking for an execution attribute to determine if a type is a test method or not.

GetMethodWrappersFromType gathers all relevant public non-static methods on a type that have execution attributes and returns the methods as an ordered list of MethodWrappers (discussed below). In an embodiment using the .Net environment, the list is ordered using the sort functionality built into .Net arrays so that the MethodWrapper calls a compare routine to order the list. If an instance of the type cannot be created, this method fails and returns an empty list.

The extraction engine can use a test service to retrieve information that can be used to modify a test extraction. The information can be stored in a file such as an XML file that is in accordance with a schema defined for storing test extraction information. If the data provided by the test service does not refer to an XML file in accordance with the schema, the modification data can be ignored.

The extraction engine typically loads all extraction modifier XML files specified. The contents of the XML files are, for example, placed into two "buckets:" test inclusions, and test exclusions. If both buckets are empty, the extraction engine should include all tests. This case is equivalent to having no extraction modifier xml files, or not being able to retrieve the Extraction Engine Data Source test service. If only the exclusion bucket is empty, the extraction engine should include all tests. If only the inclusion bucket is empty, the extraction engine should include all tests, and exclude tests listed in the exclusion bucket. If both buckets have data, the extraction engine should include tests in the inclusion bucket that are not listed in the exclusion bucket (such that the exclusion list has controlling authority over the inclusion list).

Test Method Executors

Test method executors 224 are used to execute a test method without requiring the caller to have beforehand knowledge about the method or its attributes. An Invoke method is called to execute a test method. An object holding the result of the operation is returned (pass, fail, skip, and the like). The Invoke method is responsible for processing the attributes associated with a method and creating a parameter list (if required) for the method being invoked. Execution is typically modified by the attributes associated with the test method.

An Abort method can be called to abort a currently executing test method. The abort typically causes a currently running Invoke method to return. After an abort is performed, no further tests can normally be run.

A CompareTo method is called to compare two Test Method Wrappers. If the result returned is less than zero, it indicates that this method should be executed before the other Test Method Wrapper (to which the method is compared). If the result returned equals zero it indicates that the order in which both methods are executed in does not matter. If the result returned is greater than zero, it indicates that this method should be executed after the other Test Method Wrapper.

A GetMethodAttributes method is called to retrieve sorted list of attributes associated with the test method, which are derived from a common base method attribute class. This sorted list of attributes is used by the Test Method Wrapper in several locations. For example, the Invoke method (as discussed above) uses the sorted list to evaluate the attributes in the correct order. Also, the GetMethodAttributes can be used to compare one method wrapper to another. A call such as "get AttributesDescription" uses the ordered list of attributes to create a string description of the attributes associated with the method.

The test method wrapper has several properties that can be retrieved for use by the test harness, such as by calling "get Description" and "get Name." The properties are generated from the name of the method and the class from which the method was defined. Other properties can be added as needed. Note that these properties do not require the harness to know anything about the test method being queried and that additional properties can be added without requiring modifications to existing test harnesses.

The MethodResult object is used to convey the result of a test method wrapper to the test harness. Because the test harness does not necessarily have beforehand knowledge of the method being invoked, the results are expressed in abstract form.

The object typically needs to express three possible outcomes from trying to execute a method: pass, skip, or fail. A "pass" would typically indicate that the method completed execution without any errors (for example, the method logged no failures, the test method did not throw an exception, and none of the attributes had an error). An "error" would indicate that the method failed (for example, the test method indicated a failure, or an attribute indicated a failure). A "skip" would indicate that the method was skipped rather than executed (for example, an attribute specifies the test method should only run on a server, but the test is running on a client machine; in which case the method would be skipped).

The MethodResult object can also contain optional messages such as a result message and/or an error message. The result message can be a human readable description of the methods result. Upon a successful execution of a method, this could be left blank, or it could contain the number of passes recorded. For a completed method in which an error occurred, a textual description of the error may be included while the error message can contain the details of the error.

When an exception is "thrown" by an attribute a TestConditionException class can be used to convey a modified method state. For example, three derived classes that map directly to a method state include TestSkipException, TestSucceededException, and TestErrorException.

Attributes 223 are typically used to modify and control the execution of a test. A test is executed according to a test case scenario, which can be defined through the use of attributes. At least three basic types of attributes can be used: class level attributes, method level attributes, and parameter level attributes.

Test class attributes are optional and can be used to modify an instantiated object state, such that test extraction can be skipped or caused to be performed multiple times for a denoted type. Pre- and post-extraction methods are typically used to modify the instantiated object state. Test class attributes allow such variations in test case scenarios to be implemented.

Method level attributes are capable of modifying method parameters and method execution. In an embodiment, method level attributes include execution attributes and supplemental attributes. Both attributes have pre- and post-invocation methods. The order in which method level attributes are evaluated is determined by an order property, which is defined when the attribute is written; however, attributes typically have no beforehand knowledge of what other attributes may be present. Execution modification at each stage can be handled by a priority based state system—the attribute returning a state with the highest priority is typically used to determine how execution is modified.

Execution attributes are used to mark a method as a test method. A method without an execution attribute is usually not included in a test. The core responsibility of an execution attribute is to establish a high-level order to the test and to evaluate method results. A method should not have more than one execution attribute. Extraction and execution behavior when more than one execution attribute is present is normally undefined. Examples of execution attributes include "Setup", "Step", and "Teardown" attributes.

Supplemental attributes perform supplemental actions to modify the execution of a test method. The core responsibility of a supplemental attribute is to perform secondary tasks that are necessary for the execution of a test. They typically are not used to denote high-level order. A method may have any number of supplemental attributes. Examples of supplemental attributes include "WaitFor" and "Target" attributes.

Parameter level attributes are optionally used to modify the parameter input to a method and to modify a state of an object (e.g., the context state) after a method has executed. A parameter level attribute is normally not used to alter the execution of a test as method level attributes are used. However, if an exception is thrown, the test method fails immediately in response to the exception. In an embodiment, there is only one parameter level attribute per parameter; behavior with more than one parameter level attribute is left undefined. Parameter level attributes are evaluated after method level attributes are evaluated before a method is invoked, and before method level attributes are evaluated after a method is invoked. An example of a parameter level attribute includes the "ContextMapping" attribute.

The MethodState object is used by method attributes to control the execution of a test method. Because a plurality of attributes can be assigned to a test method (and because each attribute can potentially alter the execution of the test method), each attribute can communicate with the MethodState object to ensure consistent execution of the test method.

The MethodState object can comprise information related to the execution state, a message, an error code, and a state override priority. The execution state comprises information regarding how the method has terminated (e.g., skip, pass, fail), whether the state is permitted to be changed, and whether the method should be executed. The message can be used to optionally present text that indicates why the test method is in a particular state. The error code can be used to indicate the details of an error that the test method wrapper might encounter while executing a test method. The state override priority field can be used to improve the consistency of test method execution by allowing the execution state, message, and the error code to be altered only if the new state has a priority greater than the existing state.

The test method wrapper (224) executes a test method until a terminating state is reached. When the terminating state is reached, the MethodResult object is constructed from the final MethodState object.

Execution attributes are responsible for parsing the result obtained from a method invocation. To determine if a method passed or failed, logs can be monitored for pass and fail entries. If any failures are logged, the method likely failed. If no passes or failures were logged, the method also likely failed. If an exception was thrown from the test method or any attributes, the method again likely failed. Otherwise the method can be considered to have (successfully) passed.

Test Case Scenario

In one embodiment, test case scenario 230 is a collection of objects that coordinate the execution of test methods for a particular test case. The test methods can be written without beforehand knowledge of the test harness because of the interface provided by and through the test method executor (224).

Test case scenario 230 typically comprises test methods 231 and other methods and data 232. Test methods access test harness objects by using the runtime object (which comprises the test method executor), rather than by querying specific test harnesses.

Test Harness

In one embodiment, test harness 210 is a collection of objects that coordinate the execution of test cases and provides various test services. Test harness 210 typically comprises a UI (User Interface) 211, an Execution Engine 212, a Context object 213, and a Logging object 214. The test harness for purposes of added functionality may comprise other objects such as an automation system interface.

Figure 3:
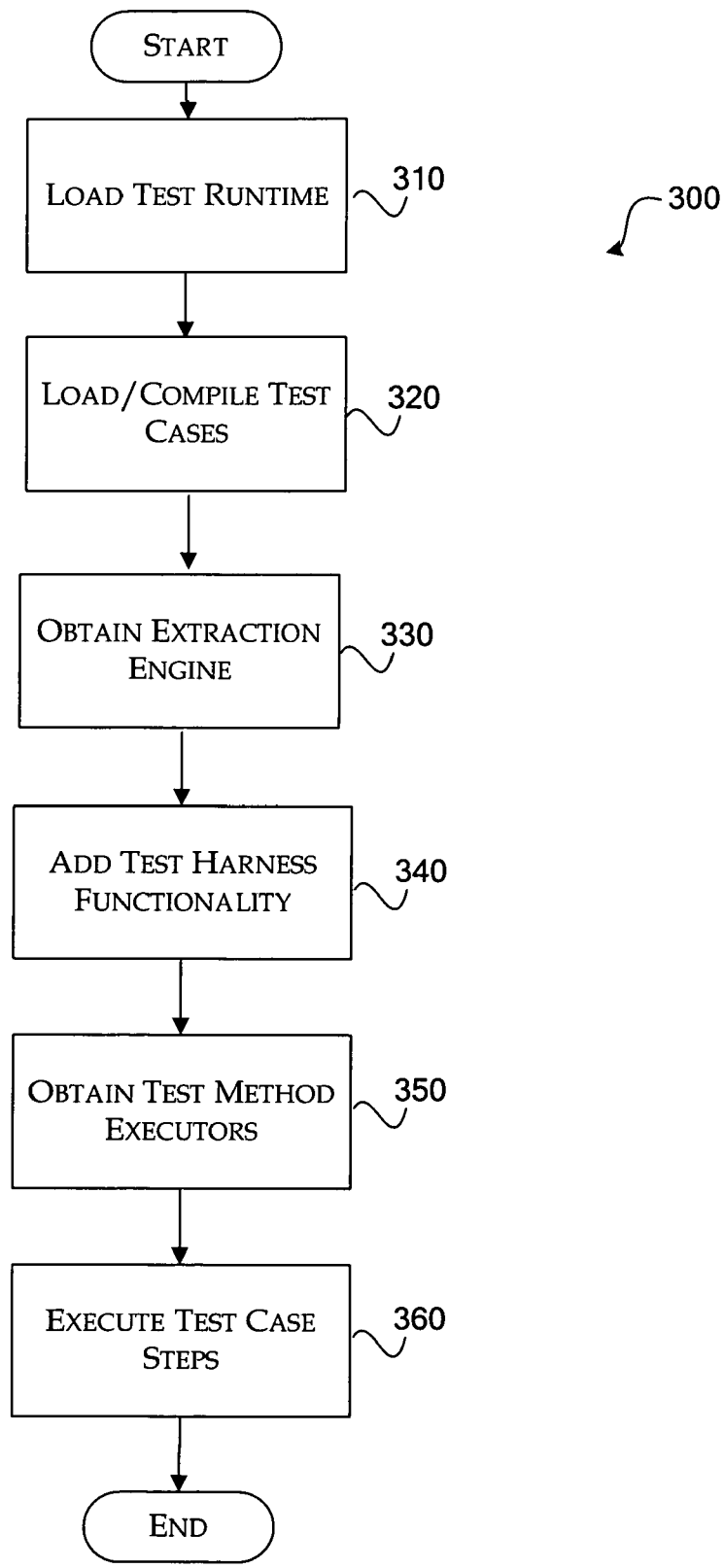
FIG. 3 illustrates of a process 300 flow of an execution engine, in accordance with aspects of the invention.

The execution engine (212) is responsible for loading and executing test case scenarios using the test runtime (220). FIG. 3 illustrates of a process 300 flow of an execution engine, in accordance with aspects of the invention. After a start block, the process moves to block 310, at which point a test runtime is loaded. In an embodiment wherein the test runtime is written in .Net, the test runtime assembly and test case scenario assembly is loaded into an AppDomain. The test harness can display information such as the version of the .Net runtime loaded, or the version of the test runtime being used.

At block 320, one or more test cases are loaded/compiled into memory. The test cases can be precompiled and loaded into memory or loaded into memory and then compiled. The test harness can display information about the test case scenario as well as whether the test case scenario loaded and/or compiled successfully.

Continuing at block 330, the extraction engine is obtained. The extraction engine is obtained by first retrieving the test services provider object (221). Next, the type of the base extraction engine is determined from the test method executor (220). The static GetService function on the test services provider object is called (passing the type of the base extraction engine to the test services provider object) to receive a reference to an extraction engine.

At block 340, test harness functionality is added to the test services provider. The AddService method on the test services provider is used to add to the test services provider the test services that are implemented on the test harness. The test services include objects that implement various interfaces such as the reboot mechanism, logging, context, and the like. If it is desirable to pass data to the extraction engine (such as, for example, an XML file to specify that certain method should be included or skipped), a test service object that implements a test harness data provider interface can be used.

At block 350, the extraction engine is used to get test case steps. The extraction engine obtained at block 330 is used to call a GetTestMethodWrappers method of the extraction engine, passing to the method the AppDomain holding the test case. An array of TestMethodWrappers is typically returned.

The array of method wrappers typically contains a list of test actions that should be executed in the order in which they are present in the array. (The extraction engine is typically responsible for ordering the array).

At block 360, the list of methods retrieved at block 350 is executed in the order in which the methods are listed. Each method is executed by calling the Invoke method. The invoke method typically returns details about the result the test action. The details may include a success/fail/skip result, as well as additional details. The details of the result may be, for example, logged, or used to update the UI.

Figure 4:
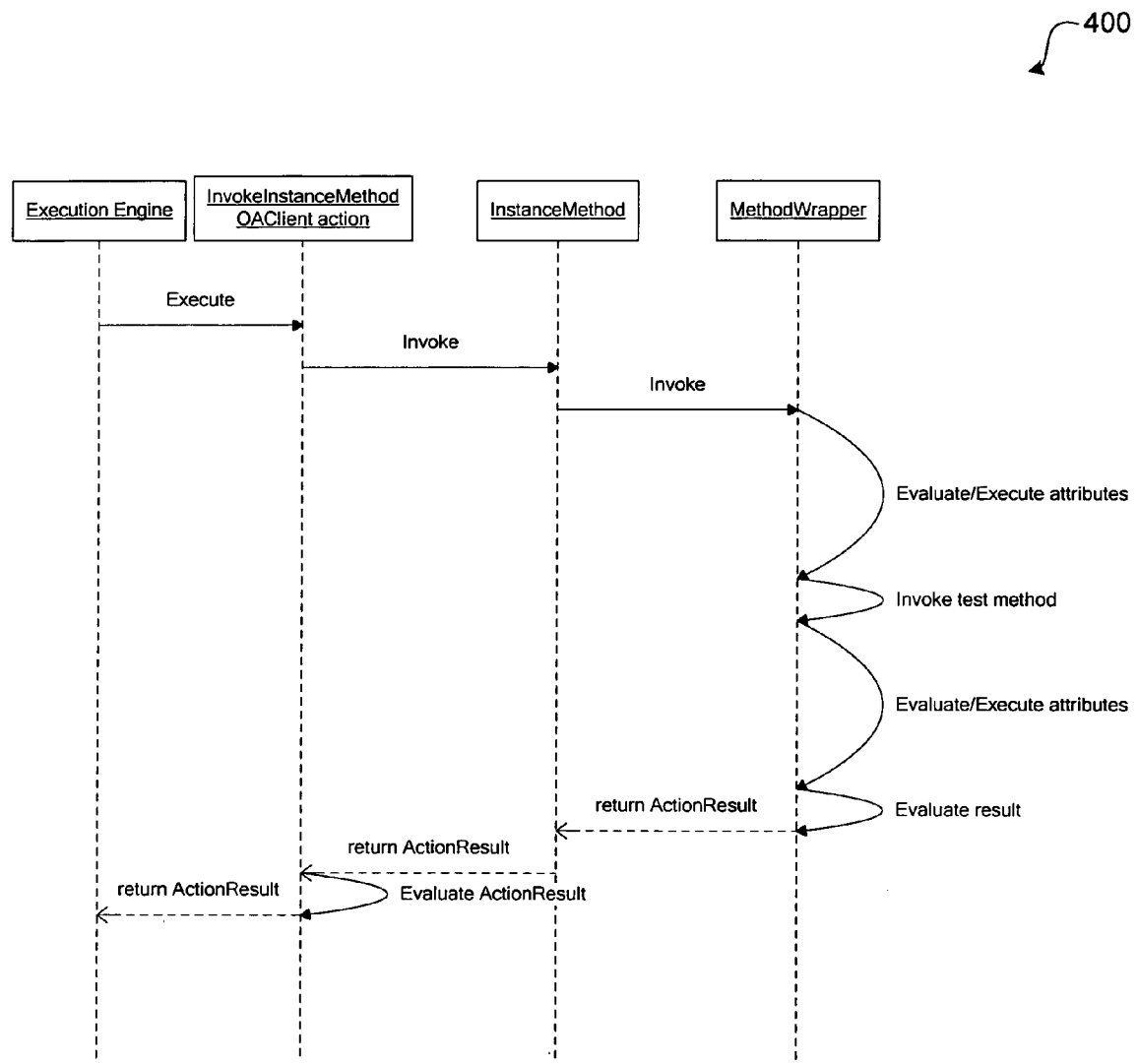
FIG. 4 is a further illustration of a process 400 flow of an execution engine, in accordance with aspects of the invention.

FIG. 4 illustrates of a process 400 flow of an execution engine, in accordance with aspects of the invention. For each test action, process 400 is repeated. The execution engine calls the InvokeInstanceMethod to initiate the execution of a particular test action. The InvokeInstanceMethod calls the InstanceMethod to invoke the particular test action. The InstanceMethod in turn calls the Method Wrapper (i.e., an example test method executor) to invoke the particular test action.

The method wrapper evaluates and executes the attributes (pre-invocation) of the particular test action. The method wrapper next invokes the test method in accordance with the evaluated/executed test method. After the test method has been executed, the attributes are again evaluated/executed (post-invocation). The method wrapper construes the result of the post-invocation attribute evaluation and returns a value that that signals the result. The ActionResult is passed to the InstanceMethod, and to the InvokeInstanceMethod in turn. The InvokeInstanceMethod evaluates the return value and passes the result to the execution engine.

As a further illustration of the invention, a listing of pseudocode is provided as follows:

```
ExtractionEngine.GetTestMethodWrappers
TestMethodWrappers [ ] methodWrappers;
For ( each assembly in AppDomain )
{
    For ( each type in assembly )
    {
        If ( TypeIsATestCase(type) )
        {
            methodWrappers +=
GetMethodWrappersFromType(type)
        }
    }
}
Return methodWrappers
ExtractionEngine.GetMethodWrappersFromType
TestMethodWrappers [ ] allMethodWrappers
ExtrationState curState = invalid state
Do
{
    TestMethodWrappers [ ] instanceMethodWrappers
    curState.Reset ( )
    if ( type is creatable )
        Object testObject = new type;
    Else
        Return empty list;
    For ( each attribute on type )
    {
        If ( attribute is kind of test case attribute )
            curState = Attribute.PreExtract (testObject)
    }
    If ( curState = terminating state )
        break;
    MethodInfo [ ] potentialTestMethods =
type.GetAllPublicMethods ( )
    For ( each method in potentialTestMethods )
    {
        If ( MethodIsATestMethod (method ) )
        {
            TestMethodWrapper wrapper = new
Wrapper (obj, method)
            If (
!wrapper.GetMethodAttributes[0].Inherit )
            {
                If ( method.definingType == type )
                    instanceMethodWrappers += wrapper
            }
            Else
                instanceMethodWrappers += wrapper
        }
    }
    For ( each attribute on type )
    {
        If ( attribute is kind of test case attribute )
            curState = Attribute.PostExtract ( )
    }
    instanceMethodWrappers.Sort ( )
    allMethodWrappers += instanceMethodWrappers
}
While ( curState != terminating state ) // invalid state
or skip
Return allMethodWrappers;
TestMethodWrapper.Invoke
MethodState curState = invalid state
Do
{
    curState.Reset ( )
    TestMethodAttribute [ ] methodAttributes =
GetMethodAttributes ( )
    methodAttributes.Reverse ( )
    // pre-invoke for all attributes
    Try
    {
        // method level attributes
        For ( each attribute in methodAttributes )
        {
            MethodState newState =
attribute.PreInvoke ( . . . )
            if ( newState.execstate != nochange &&
                newState.priority > curState.priority
```

-continued
```
                )
                {
                        curState = newState
                }
        }
}
Catch (UnexpectedCondition)
{
        curState = new MethodState (UnexpectedCondition) ;
}
Catch (e)
{
        // if an attribute throws an exception, the
invoke fails
        curState = new MethodState(e);
        break;
}
// evaluate state and stop invoke if necessary --
state must
        // be evaluated before examining parameter level
attributes
        if ( curState.execstate == terminating state )
        {
                break;
        }
        Try
        {
                // parameter level attributes -- these
attributes can't
                // modify state, but if they throw the invoke
fails
                For ( each parameter on the method )
                {
                        For ( each attribute on the parameter )
                        {
                                If ( attribute is kind of
                                MotifParamAttribute )
                                        Attribute.PreInvoke ( . . . )
                        }
                }
        }
        Catch(e)
        {
                curState = new MethodState(e)
                break;
        }
        // execute test method
        Object result;
        Try
        {
                result = method.invoke ( . . . )
        }
        Catch(e)
        {
                // note that if the method throws, the test does
                // not automatically fail; instead the exception
is
                // treated as a return value for the execution
attribute
                // to deal with
                result = e
        }
        // post-invoke on all attributes
        // if any attribute throws, the invoke fails
        curState.Reset ( )
        Try
        {
                // post invoke for parameter level attributes
                For ( each parameter on the method )
                {
                        For each ( attribute on the parameter )
                        {
                                If ( attribute is kind of
                                MotifParamAttribute )
                                        Attribute.PostInvoke ( . . . )
                        }
                }
                // post-invoke on all method level attributes
                For ( each attribute in methodAttributes )
```

-continued
```
                {
                        MethodState newState = attrib.PostInvoke ( . . . )
                        If ( new State.execstate != nochange &&
                                newState.priority > curState.priority
                )
                        {
                                curState = newState;
                        }
                }
        }
        Catch (UnexpectedCondition)
        {
                curState = new MethodState(UnexpectedCondition);
        }
        Catch(e)
        {
                curState = new MethodState(e)
                break;
        }
}
While ( curState != terminating state )     // success,
error,
                                            // skip, invalid state
Log final state
Return MethodResult (curState);
ExecutionAttribute.PreInvoke
logManager = TestServiceProvider.GetService(LogManager)
If ( logManager == null )
        Throw UnexpectedErrorCondition("LogManager object not
found")
logManager.AddListener(us)
Return MethodState(execute, low priority)
ExecutionAttribute.PostInvoke
LogManager.RemoveListener(us)
If ( result if kind of exception )
{
        Return MethodState(failed, low priority)
}
Else If ( failedCount > 0 )
{
        Return MethodState(failed, medium priority)
}
Else If ( passedCount == 0 )
{
        Return MethodState(failed, medium priority)
}
Else // passedCount > 0, failedCount = 0
{
        Return MethodState(pass, medium priority)
}
TargetAttribute.PreInvoke
If ( Context.CurrentMachine not in RunOnMachinesList )
        Throw UnexpectedSkipCondition(Context.CurrentMachine
        + " not in " +
                RunOnMachinesList)
Else
        Return MethodState(nochange)
VariationsAttribute.PostInvoke
currentVariation++;
If ( currentVariation < totalVariations )
        Return MethodState(execute, high priority)
Else
        Return MethodState(pass/fail, medium priority)
```

The above specification, examples and data provide a complete description of the manufacture and use of the composition of the invention. Since many embodiments of the invention can be made without departing from the spirit and scope of the invention, the invention resides in the claims hereinafter appended.

We claim:

1. A computer-readable medium having computer-executable components, comprising:

a test case scenario object that comprises test methods that are arranged to test an electronic system;

a test harness that is arranged to provide system test services; and a test services provider that is arranged to register the system test services and to invoke a particular registered test service from the test harness in response to a request from a test case scenario object test method requesting the particular registered test service, wherein the test services provider is further arranged to store references to test service objects that implement the system test services, wherein the references are stored in response to requests by the test harness.

2. The computer-readable medium of claim 1, wherein one of the test service objects is retrieved in response to a request by the test case scenario object.

3. A method for automated testing, comprising:

providing test methods that are arranged to test an electronic system;

providing test services that are associated with a test harness;

registering the test services with a test services provider;

executing one of the test methods; and invoking a registered test service in response to a request from the executing test method, wherein the references are stored in response to requests by the test harness.

4. The method of claim 3, wherein one of the test service objects is retrieved in response to a request by the test case scenario object.

5. A system having computer-executable components, comprising:

a test case scenario object that comprises test methods that are arranged to test an electronic system;

a test harness that is arranged to provide system test services; and a test services provider that is arranged to register the system test services and to invoke a particular registered test service from the test harness in response to a request from a test case scenario object test method requesting the particular registered test service, wherein the test services provider is further arranged to store references to test service objects that implement the system test services, wherein the references are stored in response to requests by the test harness.

6. The system of claim 5, wherein one of the test service objects is retrieved in response to a request by the test case scenario object.

7. A test automation system, comprising:

means for providing test methods that are arranged to test an electronic system;

means for providing test services that are associated with a test harness;

means for registering the test services with a test services provider;

means for executing one of the test methods; and means for invoking a registered test service in response to a request from the executing test method, further comprising means for storing references to test service objects that implement the system test services, wherein the references are stored in response to requests by the test harness.

8. The system of claim 7, wherein one of the test service objects is retrieved in response to a request by the test case scenario object.

* * * * *

UNITED STATES PATENT AND TRADEMARK OFFICE
CERTIFICATE OF CORRECTION

| | | |
|---|---|---|
| PATENT NO. | : 7,010,454 B1 | Page 1 of 1 |
| APPLICATION NO. | : 10/815121 | |
| DATED | : March 7, 2006 | |
| INVENTOR(S) | : Orville Jay Potter, IV et al. | |

It is certified that error appears in the above-identified patent and that said Letters Patent is hereby corrected as shown below:

In column 10, line 17, delete "ExtrationState" and insert -- ExtractionState --, therefor.

In column 10, line 35, delete "Wrapper (obj, method)" and insert -- Wrapper(obj, method) --, therefor.

In column 12, line 5, delete "new State.execstate" and insert -- newState.execstate --, therefor.

In column 12, line 31, after "result" delete "if" and insert -- is --, therefor.

Signed and Sealed this

Twenty-ninth Day of September, 2009

David J. Kappos
*Director of the United States Patent and Trademark Office*